United States Patent
Lu et al.

(10) Patent No.: US 7,545,228 B1
(45) Date of Patent: Jun. 9, 2009

(54) DYNAMIC TEMPERATURE COMPENSATION FOR A DIGITALLY CONTROLLED OSCILLATOR USING DUAL MEMS RESONATORS

(75) Inventors: Crist Lu, Fremont, CA (US); Erno Klaassen, Los Altos, CA (US); Sathi Perumal, Fremont, CA (US)

(73) Assignee: SiTime Inc., Sunnyvale, CA (US)

( * ) Notice: Subject to any disclaimer, the term of this patent is extended or adjusted under 35 U.S.C. 154(b) by 107 days.

(21) Appl. No.: 11/854,517

(22) Filed: Sep. 12, 2007

(51) Int. Cl.
*H03L 1/00* (2006.01)
*H03B 5/30* (2006.01)

(52) U.S. Cl. ............ 331/175; 331/116 R; 331/116 FE; 331/116 M; 331/154; 331/176; 331/46; 331/66; 331/158; 310/315; 310/361; 374/100; 374/117; 374/163; 374/170; 374/171

(58) Field of Classification Search ................ 310/315, 310/361; 331/2, 16, 46, 56, 116 R, 116 FE, 331/116 M, 154, 158, 175, 176; 374/100, 374/117, 141, 163, 170, 171
See application file for complete search history.

(56) References Cited

U.S. PATENT DOCUMENTS

| 4,325,036 | A | * | 4/1982 | Kuwabara ................... 331/176 |
|---|---|---|---|---|
| 4,551,031 | A | * | 11/1985 | Ishikawa et al. ............ 374/117 |
| 4,633,193 | A | * | 12/1986 | Scordo ........................ 331/1 A |
| 5,382,921 | A | * | 1/1995 | Estrada et al. ............... 331/1 A |
| 5,604,468 | A | * | 2/1997 | Gillig ......................... 331/176 |
| 5,836,691 | A | * | 11/1998 | Yamauchi ................... 374/117 |
| 6,115,441 | A | * | 9/2000 | Douglass et al. ............ 377/25 |
| 6,297,705 | B1 | * | 10/2001 | Williams et al. ............ 331/44 |
| 6,695,475 | B2 | * | 2/2004 | Yin ............................ 374/171 |
| 6,995,622 | B2 | * | 2/2006 | Partridge et al. ............ 331/66 |
| 7,145,402 | B2 | | 12/2006 | Mattila et al. |
| 7,211,926 | B2 | | 5/2007 | Quevy et al. |
| 7,212,075 | B2 | * | 5/2007 | Young et al. ................ 331/176 |
| 2003/0156622 | A1 | * | 8/2003 | Gold et al. .................. 374/170 |
| 2005/0089080 | A1 | * | 4/2005 | Kishi ......................... 374/141 |
| 2005/0184822 | A1 | | 8/2005 | Mattila et al. |
| 2007/0290763 | A1 | * | 12/2007 | Partridge et al. ............ 331/154 |

\* cited by examiner

*Primary Examiner*—Arnold Kinkead
*Assistant Examiner*—Richard Tan
(74) *Attorney, Agent, or Firm*—Patterson & Sheridan LLP (57) ABSTRACT

A method for generating a temperature-compensated timing signal that includes counting, within an update interval, a first number of oscillations of a first micro-electromechanical (MEMS) resonator, a second number of oscillations of a second MEMS resonator and a third number of oscillations of a digitally controlled oscillator (DCO), computing a target DCO count based on the first number and second number of oscillations, computing a loop error signal based on the target DCO count and the third number of oscillations, and modifying an output frequency of a temperature-dependent (DCO) timing signal based on the loop error signal. The duration of the update interval may also be modified based on temperature conditions, and the update interval may also be interrupted and the output frequency immediately adjusted, if a significant temperature change is detected. Thus, dynamic and precise temperature compensation is achieved that accommodates constant, slowly changing, and rapidly changing temperature conditions.

34 Claims, 6 Drawing Sheets

DYNAMIC TEMPERATURE COMPENSATION FOR A DIGITALLY CONTROLLED OSCILLATOR USING DUAL MEMS RESONATORS

BACKGROUND OF THE INVENTION

1. Field of the Invention

Embodiments of the present invention generally relate to temperature compensated oscillators and, more specifically, to dynamic temperature compensation for a digitally controlled oscillator using dual MEMS resonators.

2. Description of the Related Art

Many electronic devices include timing circuitry that usually runs continuously so that accurate time and date information, among other things, may always be maintained. Oscillators are commonly used in the timing circuitry of such devices to produce the required timing signal. However, with many mechanical oscillators, the resonant frequency of the signal produced by the oscillator depends upon temperature. Consequently, oscillator circuits usually require some sort of temperature compensation functionality.

A typical temperature compensation system includes a temperature sensor configured to detect temperature changes at regular intervals and a frequency compensation circuit configured to correct the output frequency of the oscillator every time a temperature change is detected. Electronic temperature sensors that provide either digital values indicative of the absolute temperature of the oscillator or values indicative of relative changes in temperature are often used in such temperature compensation systems. One example of an electronic temperature sensor includes an analog temperature measurement device coupled with an analog-to-digital converter (ADC). The temperature measurement device generates an analog voltage signal based on the temperatures measured from the oscillator. The ADC receives analog temperature values from the temperature measurement device at a certain rate, converts the analog values to digital form, and then averages the digital values to obtain a final digital representation of the measured temperature.

One major drawback to using this type of temperature compensation system is that obtaining digital temperature measurements with a precision better than 1 degree Centigrade (° C.) from an electronic temperature sensor requires complex and expensive circuits that consume relatively large amounts of power. In addition, if the temperature fluctuates rapidly between sampling intervals, large errors in the output frequency can result. One solution to this problem is to decrease the time interval between temperature measurements. However, fast and precise electronic temperature sensing circuits are even more complex and expensive to implement, consume even more power, and may not be available for particular applications.

As the foregoing illustrates, what is needed in the art is a temperature compensation system that addresses one or more of the problems set forth above.

SUMMARY OF THE INVENTION

One embodiment of the present invention sets forth a system for generating a temperature-compensated timing signal. The system comprises a digitally controlled oscillator (DCO) configured to generate a temperature-dependent timing signal, a first counter coupled to a first microelectromechanical (MEMS) resonator and configured to count a first number of oscillations of the first MEMS resonator within an update interval, a second counter coupled to a second MEMS resonator and configured to count a second number of oscillations of the second MEMS resonator within the update interval, and a third counter coupled to the DCO and configured to count a third number of oscillations of the DCO within the update interval. The system further comprises a digital core coupled to the DCO, the first counter, the second counter, and the third counter. The digital core is configured to compute a target DCO count based on the first number of oscillations and the second number of oscillations, compute a loop error signal as a difference between the target DCO count and the third number of oscillations, and modify an output frequency of the temperature-dependent timing signal generated by the DCO based on the loop error signal.

One advantage of the disclosed system is that dynamic and precise temperature compensation may be achieved that accommodates constant, slowly changing, and rapidly changing temperature conditions.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
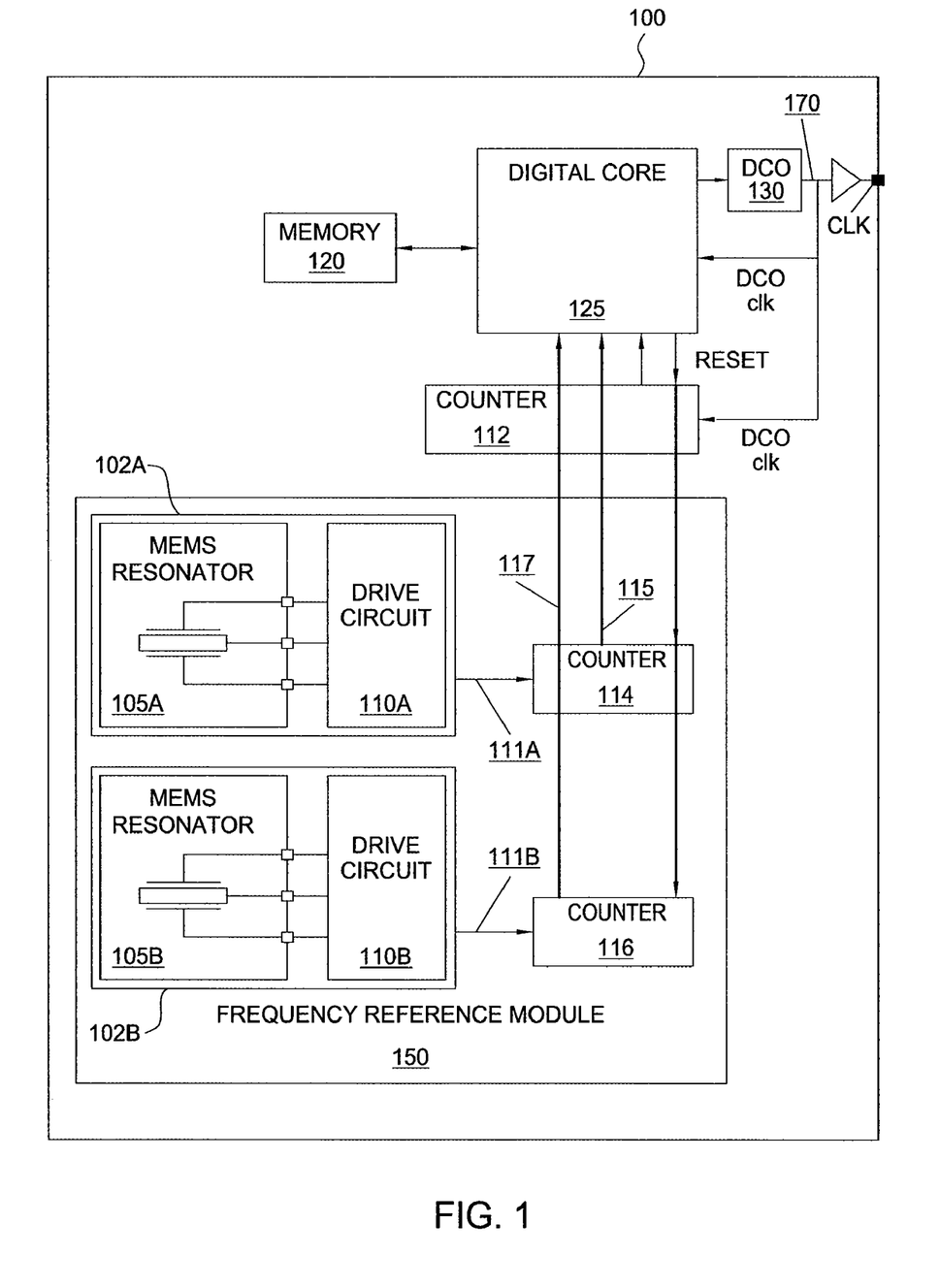
FIG. 1 is a conceptual illustration of a frequency source, according to one embodiment of the present invention.

FIG. 1 is a conceptual illustration of a frequency source 100, according to one embodiment of the present invention. As shown, the frequency source 100 includes, without limitation, a digitally controlled oscillator (DCO) 130 that generates an output signal 170 (referred to here in as a "DCO output signal"), a frequency reference module 150, a digital core 125, a counter 112, and a memory 120. Typically, the frequency of the DCO output signal 170 is temperature-dependent and varies in an unpredictable manner as a result of temperature fluctuations within the system. As described in greater detail below, the digital core 125 and the counter 112 form a servo control loop for maintaining the frequency of the DCO output signal 170 at a target value set by the requirements of a particular application, despite temperature fluctuations. Arrows indicate electronic signal paths within the frequency source 100. The frequency source 100 may be implemented in any type of electronic device that requires a timing signal, such as an electronic wrist watch, a personal digital assistant, or a cellular phone.

The frequency reference module 150 includes a MEMS oscillator 102A and a MEMS oscillator 102B. The MEMS oscillator 102A further includes a MEMS resonator 105A and an associated drive circuit 110A. Similarly, the MEMS oscillator 102B further includes a MEMS resonator 105B and an associated drive circuit 110B. The drive circuit 110A drives the MEMS resonator 105A to generate a MEMS output signal 111A with a temperature-dependent frequency, $f_1$. Similarly, the drive circuit 110B drives the MEMS resonator 105B to generate a MEMS output signal 111B with a temperature-dependent frequency, $f_2$. As designed, the temperature dependence of the frequency of the MEMS output signal 111A is different than the temperature dependence of the frequency of the MEMS output signal 111B. These temperature dependencies may be determined empirically.

Specifically, the temperature dependence of the frequency of the MEMS output signal 111A may be represented as:

$$f_1(T) = k_1 \cdot f_0 \cdot (1 + a_{r1} \cdot (T - T_o) + b_{r1} \cdot (T - T_o)^2 + c_{r1} \cdot (T - T_0)^3 + \quad (1A)$$

where T is the temperature of the MEMS resonator 105A, $f_0$ is the constant nominal frequency of the MEMS resonator 105A, $k_1, a_{r1}, b_{r1}$ and $c_{r1}$ are constants that may be determined empirically, and $T_0$ is a constant reference temperature.

Similarly, the temperature dependence of the frequency of the MEMS output signal 111B may be represented as:

$$f_2(T) = k_2 \cdot f_0 \cdot (1 + a_{r2} \cdot (T - T_o) + b_{r2} \cdot (T - T_o)^2 + c_{r2} \cdot (T - T_0)^3 + \quad (1B)$$

where T is the temperature of the MEMS resonator 105B, $f_0$ is the constant nominal frequency of the MEMS resonator 105B, $k_2, a_{r2}, b_{r2}$ and $c_{r2}$ are constants that may be determined empirically, and $T_0$ is a constant reference temperature. Since the MEMS resonators 105A and 105B reside near each other within the overall system, their temperature may be assumed to be substantially the same.

As equations (1A) and (1B) illustrate, the frequencies of the MEMS resonators 105A and 105B have different temperature dependencies. For example, the frequency of the MEMS resonator 105A may change by 30 parts per million (ppm) per degree Centigrade (° C.), while the frequency of the MEMS resonator 105B may change by only 20 ppm per 1° C. In such a scenario, if the MEMS resonators 105A and 105B normally oscillate at a frequency of 1 MHz, then a 1° C. change in temperature results in a 30 Hz frequency shift of the MEMS resonator 105A and a 20 Hz frequency shift of the MEMS resonator 105B.

As also shown, the frequency reference module includes counters 114 and 116. The counter 114 is configured to count the oscillations of the MEMS resonator 105A within a specific time interval, referred to herein as an "update interval," and provide the final count to the digital core 125, as indicated with an arrow 115. The counter 116 is configured to count the oscillations of the MEMS resonator 105B within the update interval, and provide the final count to the digital core 125, as indicated with an arrow 117. Persons skilled in the art will recognize that the number of oscillations of the MEMS resonators 105A and 105B within the update interval is proportional to the frequencies of the MEMS output signals 111A and 111B, respectively. More specifically, the frequencies of the MEMS output signals 111A and 111B may be expressed as:

$$f_1 = \frac{C_1}{t_{update}} \quad (2A)$$

$$f_2 = \frac{C_2}{t_{update}} \quad (2B)$$

where, again, $f_1$ is the frequency of the MEMS output signal 111A, $C_1$ is the number of counts accumulated in the counter 114 during the update interval, $f_2$, again, is the frequency of the MEMS output signal 111B, $C_2$ is the number of counts accumulated in the counter 116 during the update interval, and $t_{update}$ is the duration of the update interval.

Figure 2:
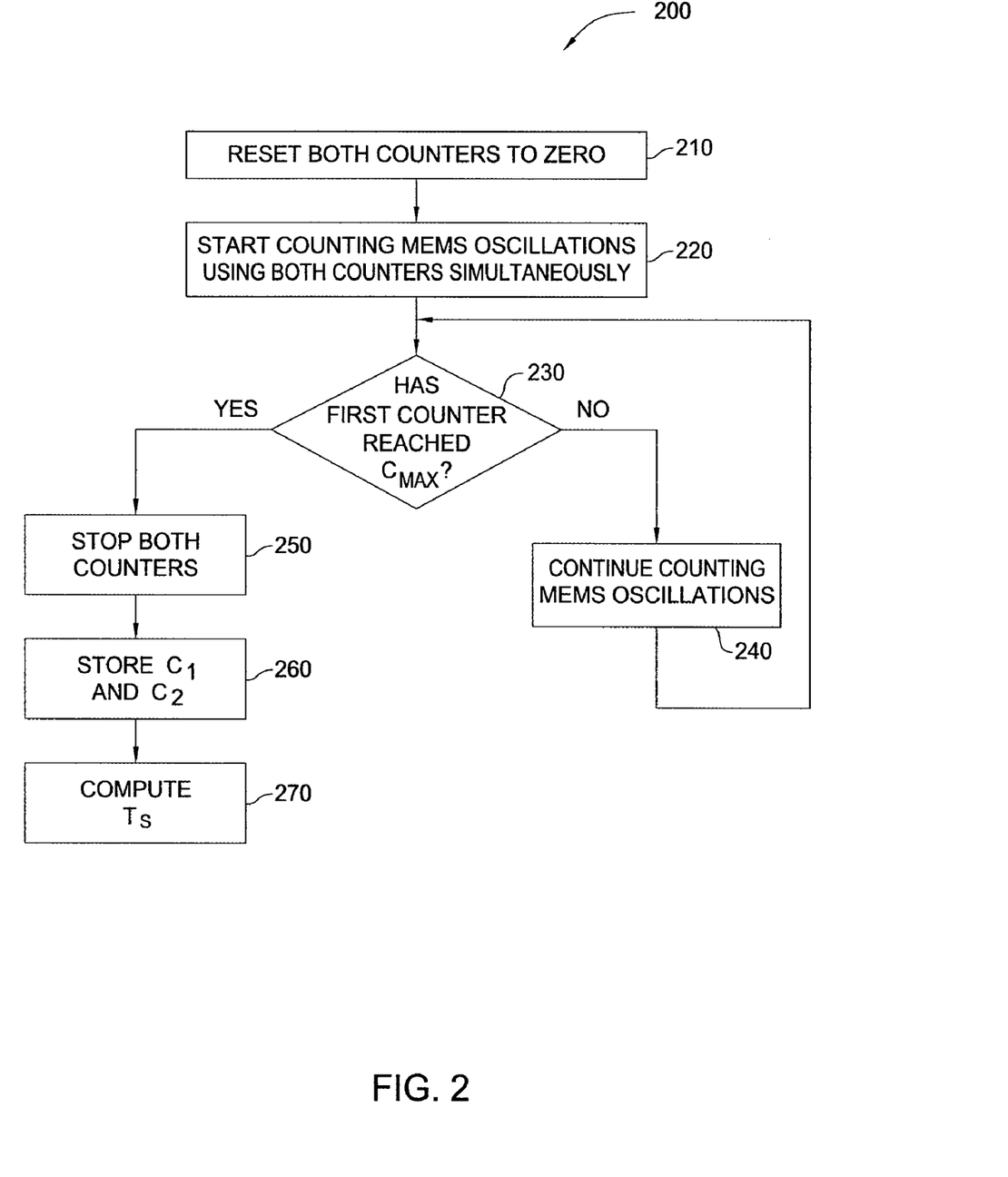
FIG. 2 sets forth a flow diagram of method steps for determining a temperature parameter associated with the MEMS resonators of FIG. 1, according to one embodiment of the present invention.

As described in greater detail in FIG. 2, knowing $C_1$, $C_2$, and how each of the frequencies $f_1$ and $f_2$ behaves as a function of temperature, allows the digital core 125 to compute a parameter that is roughly proportional to the temperature of the MEMS resonators 105A and 105B, referred to herein as a "temperature parameter," and denoted as $T_s$. Once $T_s$ is determined, using either equation (2A) or equation (2B), the duration of the update interval may be determined.

In similar fashion, the number of oscillations of the DCO 130 within the update interval is proportional to the frequency of the DCO output signal 170. More specifically, the target frequency of the DCO output signal 170 may be expressed as:

$$f_T = \frac{C_T}{t_{update}} \quad (3)$$

where $f_T$ is the target frequency of the DCO output signal 170, $t_{update}$, again, is the duration of the update interval, and $C_T$ is the number of oscillations the DCO 130 would undergo within the update interval if the frequency of the DCO output signal 170 were at the target frequency value. This target number of oscillations is referred to herein as the "target DCO count." Since the value of $f_T$ is set by the requirements of a particular application, and $t_{update}$ may be computed as described above, equation (3) allows the digital core 125 to compute $C_T$.

A counter 112 included in the frequency reference module 150 is configured to count the actual oscillations of the DCO 130 within the update interval, and provide the final count to the digital core 125. Again, the number of actual oscillations of the DCO 130 within the update interval is proportional to the actual frequency of the DCO output signal 170. The actual frequency of the DCO output signal 170 may be expressed as:

$$f_{DCO} = \frac{C_{DCO}}{t_{update}} \quad (4)$$

where $f_{DCO}$ s the actual frequency of the DCO output signal 170, $t_{update}$, again, is the duration of the update interval, and $C_{DCO}$ is the number of counts accumulated in the counter 112 during the update interval (referred to herein as an "actual DCO count"). Thus, at the end of each update interval, three quantities are available to the digital core 125: $C_1$, $C_2$, and $C_{DCO}$. The digital core 125 may then use the memory 120 to store these quantities.

As becomes clear from reviewing equations (3) and (4), comparing the actual DCO count, $C_{DCO}$, with the target DCO count, $C_T$, enables the digital core 125 to determine whether the actual frequency of the DCO output signal 170 is at the desired, target value. If the actual DCO count is close to the target DCO count, then the frequency of the DCO output signal 170 is substantially at the target value. If, however, the actual DCO count is not close to the target DCO count, then the frequency of the DCO output signal 170 has diverged from the target value due to temperature fluctuations within the system. Thus, based on the difference between the actual DCO count and the target DCO count, the digital core 125 can modify the frequency of the DCO output signal 170 to produce the temperature-independent DCO output signal 170, which can be used as a timing signal. FIGS. 2 through 6 now describe this approach in greater detail.

FIG. 2 sets forth a flow diagram 200 of method steps for determining a temperature parameter associated with the MEMS resonators 105A and 105B of FIG. 1, according to one embodiment of the present invention. Persons skilled in the art will understand that any system configured to perform the method steps, in any order, is within the scope of the invention.

The method begins in step 210, where, at the beginning of an update interval, the counters 114 and 116 are reset to zero. In step 220, the counters 114 and 116 simultaneously start counting oscillations of the MEMS resonators 105A and 105B, respectively. In step 230, the digital core 125 determines whether the counter 114 has reached a predetermined maximum number of counts, $C_{MAX}$, that indicates to the digital core 125 the end of the update interval. In one embodiment, $C_{MAX}$ is defined as $2^N$, where N is a parameter that determines the number of oscillations counted by the counter 114 during the update interval. If, in step 230, the digital core 125 determines that the counter 114 has not yet reached $2^N$, then, in step 240, the counters 114 and 116 continue counting the oscillations of the MEMS resonators 105A and 105B, respectively, and the method returns to step 230, described above.

If, however, in step 230, the digital core 125 determines that the counter 114 has reached $2^N$, then the method proceeds to step 250, where the digital core 125 stops the counters 114 and 116. In step 260, the digital core 125 stores in the memory 120 the number of counts accumulated in each of the counters 114 and 116 during the update interval. In step 270, based on the temperature dependence of the frequencies of the MEMS output signals 111A and 111B, described by equations (1A) and (1B) above, the digital core 125 computes the temperature parameter as follows:

$$T_s = 2^{J-N} \cdot (r_f \cdot C_2 - C_1) \quad (5)$$

where $k_1$ and $k_2$ are constants from equations (1A) and (1B), $r_f = k_1/k_2$, and J is a constant related to the maximum number of counts (i.e., $2^N$ counts) in the counter 114. The temperature parameter $T_s$ is roughly proportional to the temperature of both MEMS resonators 105A and 105B.

As previously described herein, at the end of each update interval, three quantities are available to the digital core 125—$C_1$, $C_2$, and $C_{DCO}$. Since the counters 112, 114, and 116 are configured to count oscillations until the counter 114 reaches $2^N$, the value of N affects the duration of the update interval as well as the precision of the computation of the temperature parameter and of the target DCO count. As described in FIG. 3, the value of N may be dynamically adjusted depending on the existing temperature conditions. For example, when the system temperature is substantially constant, the frequency of the DCO output signal 170 varies only slightly over time. Therefore, the value of N may be increased to increase the update interval, causing the frequency of the DCO output signal 170 to be modified less often, which results in substantial power savings relative to prior art approaches. Conversely, when the system temperature is rapidly changing, the value of N may be decreased to allow the frequency of the DCO output signal 170 to be modified more often to account for the greater number of temperature-induced frequency changes.

Figure 3:
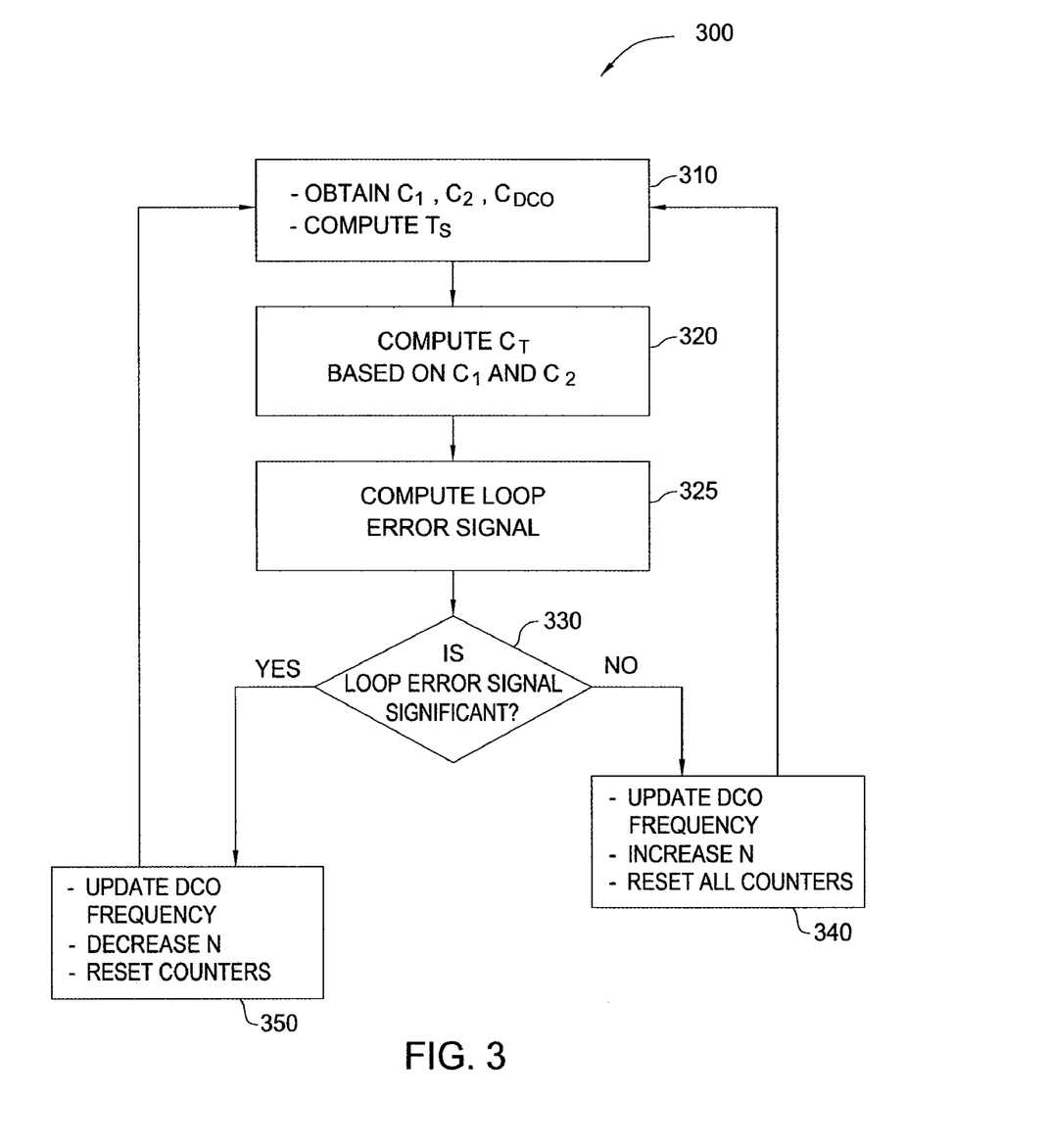
FIG. 3 sets forth a flow diagram of method steps for dynamic temperature compensation within the frequency source of FIG. 1, according to one embodiment of the present invention.

FIG. 3 sets forth a flow diagram 300 of method steps for dynamic temperature compensation within the frequency source 100, according to one embodiment of the present invention. Although the method steps are described in conjunction with the system of FIG. 1, persons skilled in the art will understand that any system that performs the method steps, in any order, is within the scope of the invention.

The method begins in step 310, where, as described in FIG. 2, the digital core 125 obtains the number of oscillations of the MEMS resonator 105A and the MEMS resonator 105B counted by the counters 114 and 116, respectively, during the update interval ($C_1$ and $C_2$). The digital core 125 also computes the temperature parameter $T_s$ associated with the MEMS resonators 105A and 105B based on equation (5), above, and obtains the number of actual oscillations of the DCO 130 counted by the counter 112 during the update interval ($C_{DCO}$). In step 320, based on the values of $C_1$ and $C_2$ and the computed temperature parameter $T_s$, the digital core 125 computes the target DCO count as:

$$C_T = (r_1 \cdot C_1 - r_2 \cdot C_2) \cdot (1 + a \cdot T_s + b \cdot T_s^2 + c \cdot T_s^3) \quad (6)$$

where, again, $C_T$ is the number of oscillations the DCO 130 would undergo within the update interval if the frequency of the DCO output signal 170 were at the target frequency value, and $r_1$, $r_2$, a, b, J, and c are constants.

In step 325, the digital core 125 computes a loop error signal, which is the difference between $C_T$ and $C_{DCO}$. The loop error signal indicates how far the actual frequency of the DCO output signal 170 has diverged from the target value due to temperature fluctuations within the system. When the loop error signal is small, the actual DCO count is close to the target DCO count, indicating that the frequency of the DCO output signal 170 is substantially at the target value. In step 330, the digital core 125 determines whether the loop error signal is significant. If the loop error signal is not significant, then, in step 340, the digital core 125 modifies the frequency of the DCO output signal 170 based on the loop error signal. The digital core 125 also increases the value of N since an insignificant loop error signal indicates that the system temperature is changing slowly, allowing a larger update interval. Finally, the digital core 125 resets the counters 112, 114, and 116, and the method returns to step 310, described above.

If, however, in step 330, the digital core 125 determines that the loop error signal is significant, then the method proceeds to step 350. In step 350, the digital core 125 modifies the DCO output signal 170 based on the loop error signal. The digital core 125 also decreases the value of N since a significant loop error signal indicates that the system temperature is changing rapidly, which requires smaller update interval so that the frequency of the DCO output signal 170 can be modified more frequently in response to those temperature changes. The digital core 125 also resets the counters 112, 114, and 116, and the method returns to step 310, described above.

Figure 4:
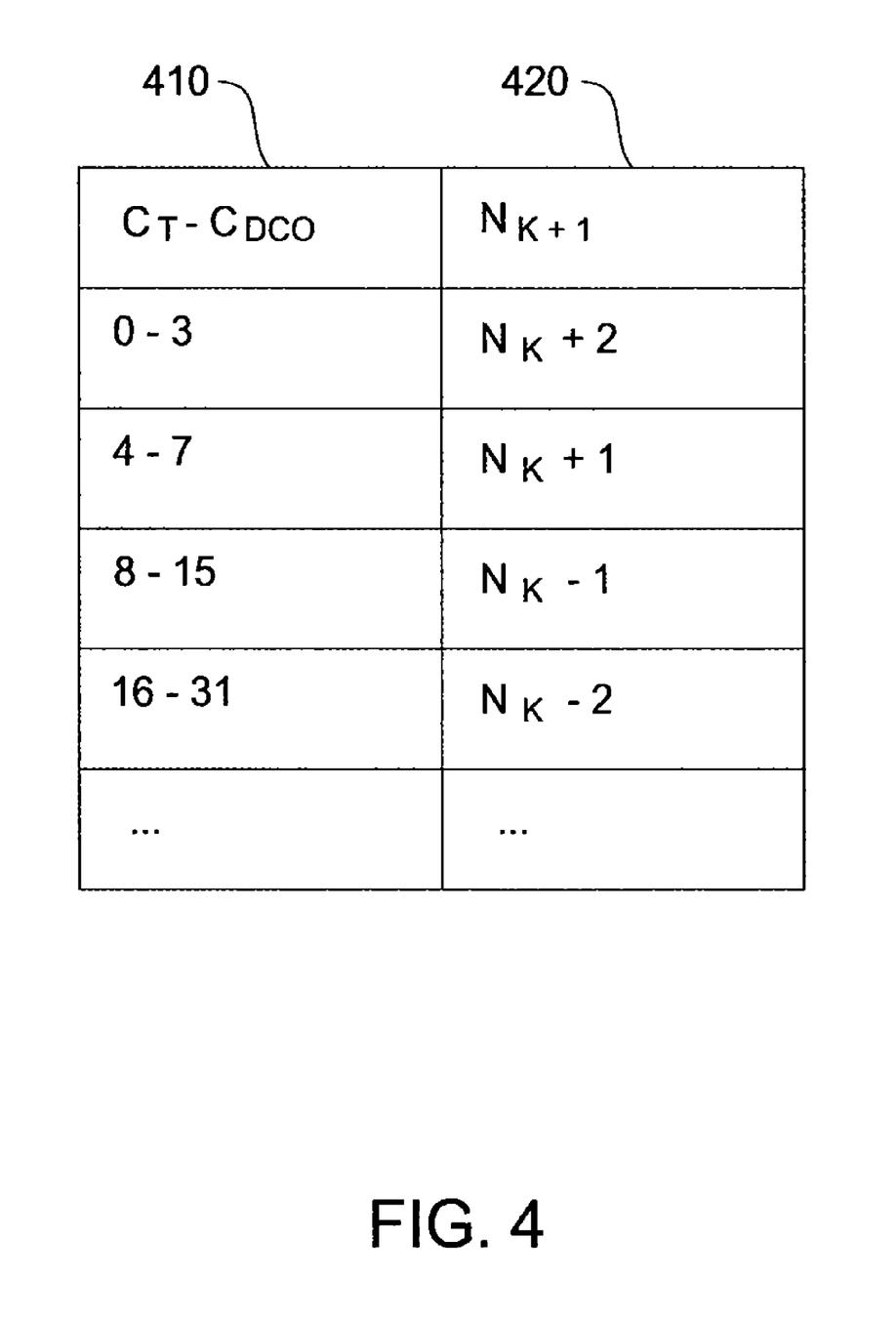
FIG. 4 is a conceptual illustration of how the value of N in the method of FIG. 3 may be updated, according to one embodiment of the present invention.

Persons skilled in the art will recognize that there are many ways to determine what constitutes a "significant" loop error signal. For example, the determination may be based on operating parameters, application requirements, environmental conditions, error budget of a system, resonant frequency of the DCO, and/or the temperature dependency of the MEMS resonators. In addition, various algorithms may be conceived for controlling how the value of N is increased or decreased based on the loop error signal. FIG. 4 describes one exemplary approach.

FIG. 4 is a conceptual illustration of how the value of N in the method of FIG. 3 may be updated, according to one embodiment of the present invention. Starting from $N_k=0$, the value of $N_{k+1}$ may be adjusted according to:

$$N_{k+1} = N_k + \log_2\left(\frac{4}{|C_T - C_{DCO}|}\right) \quad (7)$$

where $N_k$ is the value of N for the current update interval, and $N_{k+1}$ is the value of N for the update interval immediately following the current interval. The value of $\log_2(x)$ is truncated so that N is always an integer.

Column 410 sets forth the absolute value of the loop error signal for the current update interval, measured in counts. Column 420 illustrates how the value of $N_{k+1}$ may be set based on the value of $N_k$ and the loop error signal. In the example of FIG. 4, the constant J is set to 16, and N has a minimum value of 8 and a maximum value of 23, but otherwise varies according to equation (7). For purposes of discussion only, it is assumed that the loop error signal of 0 to 3 counts constitutes an insignificant loop error signal. In such a case, $N_{k+1}$ is increased by 2 over $N_k$. Since the counters 112, 114, and 116 count the number of oscillations until the counter 114 reaches $2^N$ counts, increasing $N_{k+1}$ by 2 over $N_k$ means that the counter 114 will count four times more oscillations during the next update interval relative to the current update interval. Thus, when the loop error signal is between 0 and 3 counts, a longer update interval is implemented, resulting in higher precision computations of the temperature parameter $T_s$ and the target DCO count.

It is further assumed that the loop error signal of 8 to 15 counts constitutes a significant loop error signal. In such a case, the value $N_{k+1}$ is decreased by 1 relative to $N_k$. Thus, two times less oscillations will be counted by the counter 114 during the next update interval relative to the current update interval. As a result, when the loop error signal is significant, a shorter update interval is implemented so that more measurements of the number of oscillations may be obtained. Consequently, the frequency of the DCO output signal 170 may be modified more often in response to the changing temperature, which improves overall signal quality.

Persons skilled in the art will recognize that the range of N may be selected based on various system parameters and/or operating conditions. For example, the smallest value of N may be selected based on the processing time associated with calculating the temperature parameter and/or the time associated with the adjustment of the frequency of the DCO output signal 170. The greatest value of N may be selected based on the amount of memory and/or a reasonable maximum update interval.

Figure 5:
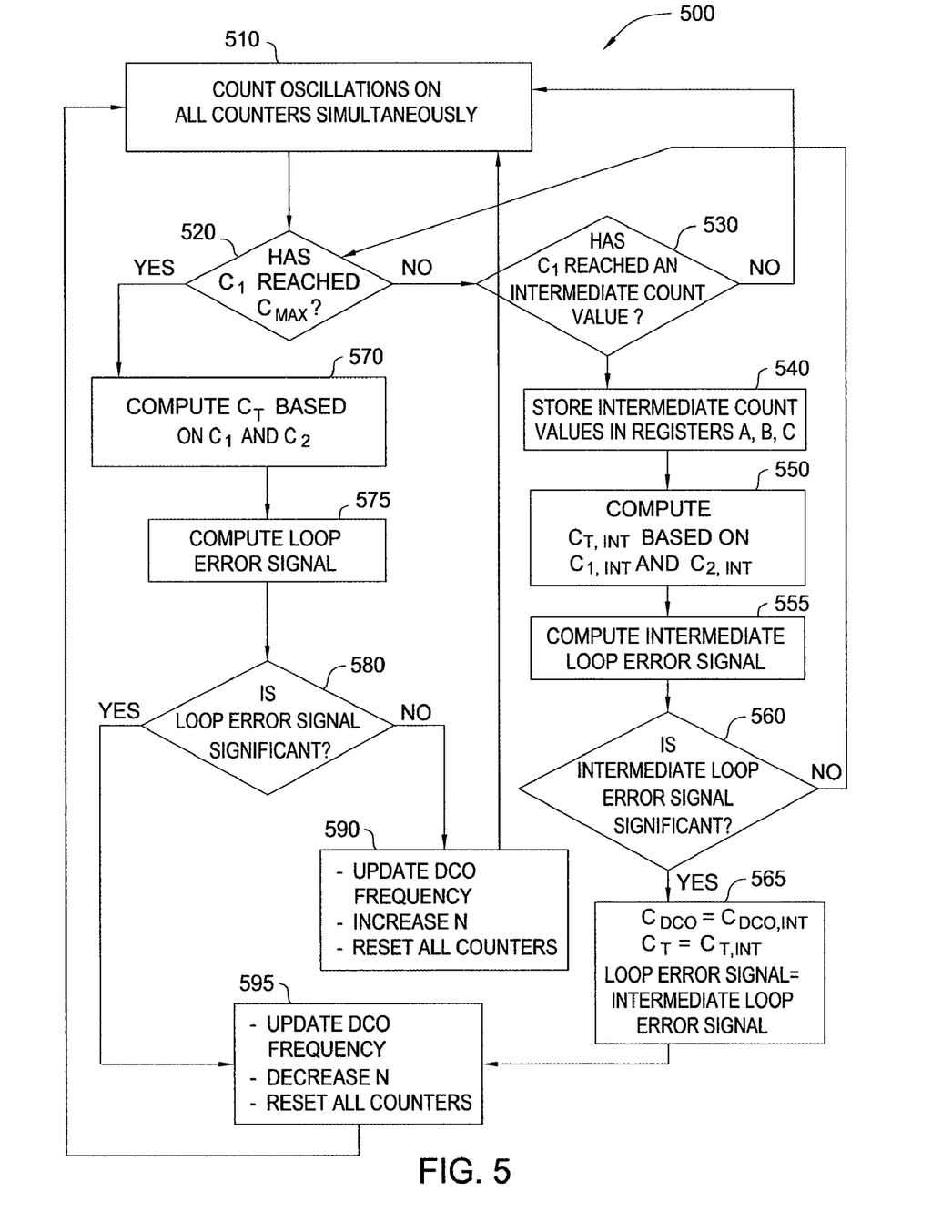
FIG. 5 sets forth a flow diagram of method steps for dynamic temperature compensation within the frequency source of FIG. 1, according to another embodiment of the present invention.

In another embodiment of the present invention, when a large temperature change occurs, the current update interval may be interrupted so that the frequency of the DCO output signal 170 may be modified more immediately to account for that temperature change. FIG. 5 describes such an implementation.

FIG. 5 sets forth a flow diagram 500 of method steps for dynamic temperature compensation within the frequency source 100, according to another embodiment of the present invention. Again, although the method steps are described in conjunction with the system of FIG. 1, persons skilled in the art will understand that any system that performs the method steps, in any order, is within the scope of the invention.

The method begins in step 510, where the counters 114 and 116 start counting oscillations of the MEMS resonators 105A and 105B, respectively, and the counter 112 starts counting oscillations of the DCO 130. As previously described herein, starting from a reset condition, the counters 112, 114, and 116 count oscillations until the counter 114 reaches a predetermined number of counts $2^N$, which indicates to the digital core 125 the end of the current update interval.

In step 520, the digital core 125 determines whether $C_1$ has reached $2^N$. If $C_1$ has not reached $2^N$, then, in step 530, the digital core 125 determines whether $C_1$ has reached an intermediate count value. As described in greater detail herein, intermediate count values for the counter 114 indicate to the digital core 125 when the values from the counters 112, 114, and 116 should be stored in one of the registers in the memory 120 and used to compute an intermediate difference between the target DCO count and the actual DCO count. The intermediate count values for a particular system are generally chosen based on two considerations. The first consideration is that as more intermediate count values are used, the more responsive the system may be to changes in temperature. The second consideration is that as more intermediate count values are used, more hardware is required, thereby adding to overall chip cost. In one embodiment, all intermediate count values for the counter 114 may be organized in a lookup table. In such an embodiment, the digital core 125 determines whether $C_1$ has reached an intermediate count value based on the values stored in the lookup table. If, in step 530, the digital core 125 determines that $C_1$ has not reached an intermediate count value, the method returns to step 510, described above. If, however, in step 530, the digital core 125 determines that $C_1$ has reached an intermediate count value, then, in step 540, the digital core 125 stores the numbers of oscillations counted by the counters 112, 114, and 116 in one of the registers in the memory 120. These numbers of oscillations are then used to compute the intermediate values of $C_1$, $C_2$, and $C_{DCO}$, (denoted as $C_{1,INT}$, $C_{2,INT}$, and $C_{DCO,INT}$, respectively).

In step 550, the digital core 125 computes the intermediate target DCO count, $C_{T,INT}$, based on the intermediate values $C_{1,INT}$ and $C_{2,INT}$. $C_{T,INT}$ may be computed in two steps using equations (5) and (6), described above, where the intermediate values $C_{1,INT}$ and $C_{2,INT}$ are used instead of the values $C_1$ and $C_2$, respectively. In step 555, the digital core 125 computes an intermediate loop error signal, which is the difference between $C_{T,INT}$ and $C_{DCO,INT}$. In step 560, the digital core 125 determines whether the intermediate loop error signal is significant. If the digital core 125 determines that the intermediate loop error signal is insignificant, then the frequency of the DCO output signal 170 is substantially at the target value, and the method returns to step 520, described above.

If, however, in step 560, the digital core 125 determines that the intermediate loop error signal is significant, then the method proceeds to step 565. In step 565, the digital core 125 designates the intermediate actual DCO count, $C_{DCO,INT}$, as the actual DCO count corresponding to the end of the current update interval, $C_{DCO}$, and the intermediate target DCO count, $C_{T,INT}$, as the target DCO count corresponding to the end of the current update interval, $C_T$. The digital core 125 also designates the intermediate loop error signal as the loop error signal corresponding to the end of the current update interval. In step 595, the digital core 125 modifies the frequency of the DCO output signal 170 based on the loop error signal. The digital core 125 also decreases the value of N since a significant loop error signal indicates that the system temperature is changing rapidly, which requires smaller update interval so that the frequency of the DCO output signal 170 can be modified more frequently in response to those temperature changes. The digital core 125 also resets the counters 112, 114, and 116, and the method returns to step 510, described above.

The determination of what constitutes a "significant" intermediate loop error signal and how the values of N should be updated based on the loop error signal may be made as described above in FIGS. 3 and 4.

As the foregoing illustrates, by storing the intermediate numbers of oscillations counted by the counters 112, 114, and 116, the computation of the target DCO count may be carried out before the current update interval is over. Such functionality enables the system to detect significant temperature changes, interrupt the update interval, and update the frequency of the DCO output signal 170 immediately, in response to these temperature changes.

Furthermore, performing the intermediate calculations allows to maintain the frequency of the DCO output signal 170 at the target value without resetting the counters 112, 114, and 116 unnecessarily often. If, based on the intermediate calculations, the digital core 125 determines that the frequency of the DCO output signal 170 has diverged from the target value, then the digital core 125 interrupts the update interval. The digital core 125 then modifies the frequency of the DCO output signal 170 in response to the temperature changes, and resets the counters 112, 114, and 116. If, however, based on the intermediate calculations, the digital core 125 determines that the frequency of the DCO output signal 170 is substantially at the target value, the digital core 125 does not reset the counters 112, 114, and 116. In such a case, the counters 112, 114, and 116 continue to count the oscillations of the DCO 130, the MEMS resonator 105A, and the MEMS resonator 105B, respectively.

Referring back now to step 520, if the digital core 125 determines that $C_1$ has reached $2^N$, then the method proceeds to step 570. In step 570, the digital core 125 computes the target DCO count, $C_T$, based on the values of $C_1$ and $C_2$ stored in one of the registers in the memory 120 and the computed temperature parameter $T_s$. Again, $C_T$ may be computed in two steps using formulas (5) and (6), described above. In step 575, the digital core 125 computes a loop error signal, which is the difference between $C_T$ and $C_{DCO}$. In step 580, the digital core 125 determines whether the loop error signal is significant. If the loop error signal is insignificant, then, in step 590, the digital core 125 modifies the frequency of the DCO output signal 170 based on the loop error signal. The digital core 125 also increases the value of N since an insignificant loop error signal indicates that the temperature is changing slowly, allowing a larger update interval. Finally, the digital core 125 also resets the counters 112, 114, and 116, and the method returns to step 510, described above.

If, however, in step 580, the digital core 125 determines that the loop error signal is significant, then the method proceeds to step 595, described above. Again, the determination of what constitutes a "significant" loop error signal and how the values of N should be updated based on the loop error signal may be made as described above in FIGS. 3 and 4.

Figure 6:
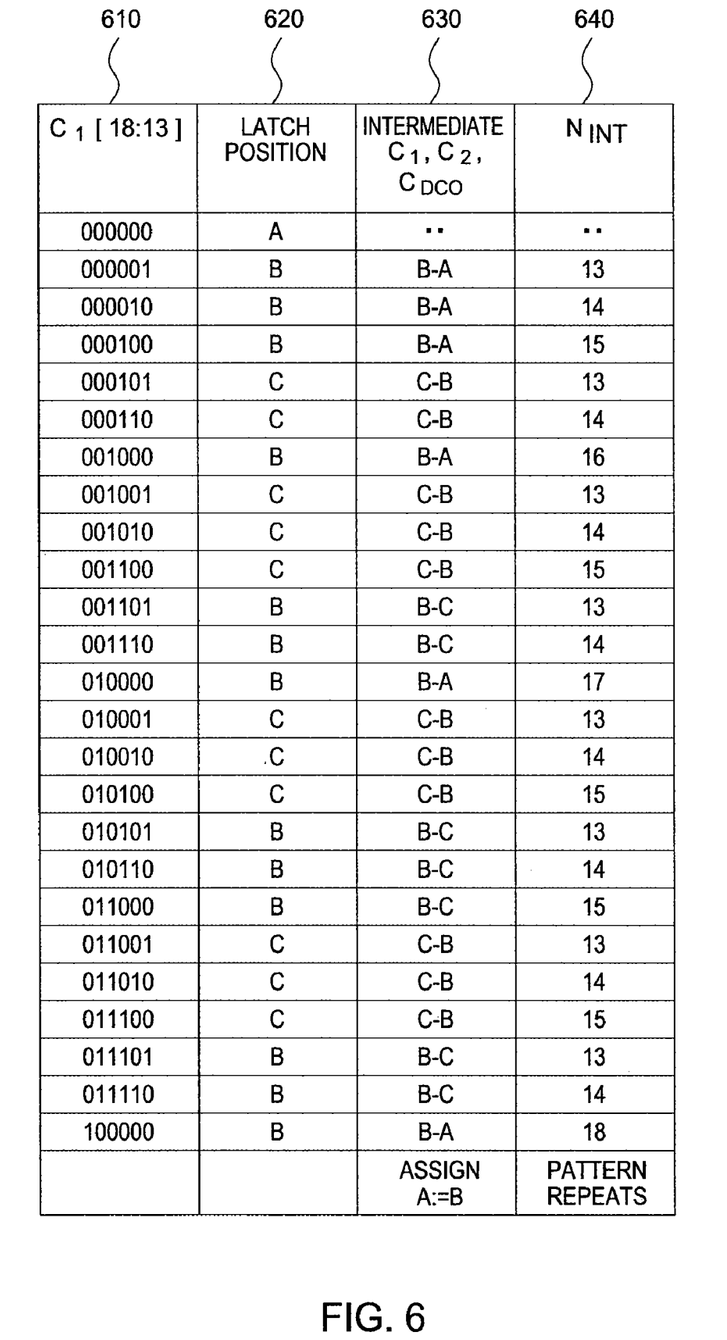
FIG. 6 is a conceptual illustration of intermediate count values for the counter 114 of FIG. 1, according to one embodiment of the present invention.

FIG. 6 is a conceptual illustration of intermediate count values for the counter 114 of FIG. 1, according to one embodiment of the present invention. For purposes of discussion only, it is assumed that the memory 120 includes three registers—A, B and C. Each register stores values of $C_1$, $C_2$ and $C_{DCO}$. Column 610 sets forth the intermediate count values for the counter 114. Column 620 indicates the latch positions corresponding to the registers that store the values from the counters 114, 116, and 112 whenever the counter 114 reaches one of the intermediate count values. Column 630 illustrates how intermediate values for the numbers of oscillations counted by the counters 114, 116, and 112 are computed. Column 640 sets forth the intermediate values of N corresponding to the intermediate count values of the counter 114.

The notation $C_1[18:13]$ refers to bits 18 through 13 of $C_1$, which is the number of oscillations counted by the counter 114, where bit 0 is the least significant bit. When $C_1[18:13]$ reaches one of the values set forth in column 610, the digital core 125 stores the values of $C_1$, $C_2$, and $C_{DCO}$ currently accumulated in the counters 114, 116, and 112, respectively, in the register corresponding to the latch position indicated in column 620. Since the counters 112, 114, and 116 begin counting oscillations starting from a reset condition, at the beginning of an update interval, $C_1[18:13]$ has a value of 000000. As set forth in column 620, when $C_1[18:13]$ is equal to 000000, the digital core 125 stores the values of $C_1$, $C_2$, and $C_{DCO}$ in register A. Now assume that $C_1[18:13]$ has reached a value of 000001. In this case, the digital core 125 stores the values currently accumulated in the counters 114, 116, and 112 in register B. Furthermore, as set forth in column 630, the digital core 125 computes the intermediate values $C_{1,INT}$, $C_{2,INT}$, and $C_{DCO,INT}$ by subtracting the values stored in register B from the corresponding values stored in register A. Because the increase in value of $C_1[18:13]$ from 000000 to 000001 reflects that the counter 114 counted 213 oscillations, the intermediate value of N is equal to 13, as set forth in column 640. The intermediate values $C_{1,INT}$, $C_{2,INT}$, and $C_{DCO,INT}$ are then used with the intermediate value of $N_{INT}$ to compute $T_s$ and $C_{T,INT}$.

Further, assume that, for the intermediate calculations corresponding to $C_1[18:13]$ having a value of 000001, the digital core 125 determines that the intermediate loop error signal is insignificant (step 560 of FIG. 5). In such a case, the counters 114, 116, and 112 continue counting the oscillations without being reset. The next intermediate count value set forth in column 610 is 000010. When $C_1[18:13]$ reaches a value of 000010, the digital core 125 stores the values currently accumulated in the counters 114, 116, and 112 in register B again. As set forth in column 630, the digital core 125 then computes the intermediate values $C_{1,INT}$, $C_{2,INT}$, and $C_{DCO,INT}$ by subtracting the values stored in register B from the corresponding values stored in register A. This time, because the increase in value of $C_1[18:13]$ from 000000 to 000010 reflects that the counter 114 counted 214 oscillations, the intermediate value of N is equal to 14, as set forth in column 640. The intermediate values $C_{1,INT}$, $C_{2,INT}$, and $C_{DCO,INT}$ are then used with the intermediate value of $N_{INT}$ to compute $T_s$ and $C_{T,INT}$. Assume here that, for the intermediate calculations corresponding to $C_1[18:13]$ having a value of 000010, the digital core 125 determines that the intermediate loop error signal is significant (step 560 of FIG. 5). In such a case, the frequency of the DCO output signal 170 has diverged from the target value and should be modified. Therefore, the digital core 125 modifies the frequency of the DCO output signal 170, decreases N, and resets the counters 114, 116, and 112 (step 595 of FIG. 5).

The computations performed according to the table of FIG. 6 as the counter 114 reaches various values of $C_1[18:13]$ provide a mechanism for the digital core 125 to respond to sudden temperature changes as needed without resetting the counters 114, 116, and 112 unnecessarily often. The loop error signal is monitored often but the output of the control loop only changes when necessary to bring the frequency of the DCO output signal 170 back to the target value. This dynamic update rate control achieves faster detection of changes in the frequency of the DCO output signal 170 when the temperature within the system is fluctuating, and slower (but more accurate) detection when the temperature is substantially constant.

One advantage of the disclosed system is that temperature control with precision higher than 1° C. can be achieved by using dual MEMS resonators with different dependence of the MEMS resonator frequency on the temperature. Two counters are configured to count the number of oscillations produced by the two MEMS resonators within a frequency update interval, which allows adjusting the frequency of an output signal produced by a digitally controlled oscillator to the desired, target value. Furthermore, improved temperature control of the frequency of the output signal produced by the digitally controlled oscillator can be achieved by adjusting the duration of the frequency update intervals depending on the temperature conditions. When the temperature is substantially constant, the update interval is increased, leading to substantial power savings since the frequency adjustments are performed less often. When the temperature is varying, the update interval is decreased so that more measurements related to the temperature within the system and the frequency of the output signal may be obtained, enabling the frequency of the output signal produced by the digitally controlled oscillator to be adjusted more often in response to the changing temperature, which improves overall signal quality. In addition, performing intermediate calculations allows the system to detect temperature changes before the current update interval completes so that the frequency of the output signal may be more immediately adjusted in view of the temperature changes. Thus, dynamic temperature compensation for constant, slowly changing, and rapidly changing temperature conditions may be achieved in a manner that is more efficient than prior art approaches.

While the foregoing is directed to embodiments of the present invention, other and further embodiments of the invention may be devised without departing from the basic scope thereof. For example, persons skilled in the art will recognize that, in various implementations, if a different type of oscillator is used in place of the DCO 130. In such implementation, a synchronizer count, $C_{SCC}$, replaces the DCO count $C_{DCO}$, and a target synchronizer count, $C_{T,SCC}$, replaces the target DCO count $C_T$ in the above example. Further, alternative embodiments contemplate changing the calculations of $T_s$ and $C_T$, using different bits in $C_1$ to latch registers A, B, and C, using different algorithms for computing the intermediate values $C_{1,INT}$, $C_{2,INT}$, and $C_{DCO,INT}$, and changing the update functions for N. Therefore, the scope thereof is determined by the claims that follow.

We claim:

1. A method for generating a temperature-compensated timing signal, the method comprising:
   generating a first final count of oscillations of a first microelectromechanical (MEMS) resonator, wherein the first final count spans a current update interval;
   generating a second final count of oscillations of a second MEMS resonator within the current update interval, wherein the first final count and the second final count are used to compute a final target DCO count;
   generating a third final count of oscillations of a digitally controlled oscillator (DCO) within the current update interval, wherein the third final count and the final target DCO count are used to compute a final loop error signal;
   generating a first intermediate count of oscillations of the first MEMS resonator, wherein the start of the first intermediate count occurs at or after the start of the first final count, and the end of the first intermediate count occurs before the end of the first final count;
   generating a second intermediate count of oscillations of the second MEMS resonator, wherein the start of the second intermediate count occurs simultaneously with the start of the first intermediate count, and the end of the second intermediate count occurs simultaneously with the end of the first intermediate count;
   generating a third intermediate count of oscillations of the DCO, wherein the start of the third intermediate count occurs simultaneously with the start of the first intermediate count, and the end of the third intermediate count occurs simultaneously with the end of the first intermediate count;
   computing an intermediate target DCO count based on the first intermediate count and the second intermediate count;
   computing an intermediate loop error signal as a difference between the intermediate target DCO count and the third intermediate count; and
   modifying an output frequency of a temperature-dependent timing signal generated by the DCO based on either the final loop error signal or the intermediate loop error signal.

2. The method of claim 1, further comprising the step of determining whether the intermediate loop error signal is significant.

3. The method of claim 2, wherein the intermediate loop error signal is significant, and further comprising the step of interrupting the current update interval before the end of the first final count.

4. The method of claim 3, wherein the output frequency is modified based on the intermediate loop error signal.

5. The method of claim 3, further comprising the step of adjusting the first final count based on the intermediate loop error signal.

6. The method of claim 5, wherein the first final count equals $2^N$, and the step of adjusting the first final count comprises decreasing the value of N based on the intermediate loop error signal.

7. The method of claim 6, wherein the value of N is decreased by 1 if the intermediate loop error signal is between 8 and 15 counts.

8. The method of claim 6, wherein the value of N is decreased by 2 if the intermediate loop error signal is between 16 and 31 counts.

9. The method of claim 2, wherein the intermediate loop error signal is insignificant, and further comprising the step of adjusting the first final count based on the final loop error signal.

10. The method of claim 9, further comprising the step of computing a temperature parameter based on the first final count and the second final count.

11. The method of claim 10, wherein the final target DCO count is computed based on the temperature parameter.

12. The method of claim 9, further comprising a step of determining whether the final loop error signal is significant.

13. The method of claim 12, wherein the first final count equals $2^N$, and the step of adjusting the first final count comprises adjusting a value of N based on the final loop error signal.

14. The method of claim 13, wherein the final loop error signal is determined to be insignificant and the first final count is adjusted by increasing N.

15. The method of claim 14, wherein the final loop error signal is between 0 and 3 counts, and N is increased by 2.

16. The method of claim 14, wherein the final loop error signal is between 4 and 7 counts, and N is increased by 1.

17. The method of claim 13, wherein the final loop error signal is determined to be significant, and the first final count is adjusted by decreasing N.

18. The method of claim 17, wherein the final loop error signal is between 8 and 15 counts, and N is decreased by 1.

19. The method of claim 17, wherein the final loop error signal is between 16 and 31 counts, and N is decreased by 2.

20. The method of claim 1, wherein the first final count equals $2^N$ counts at the end of the current update interval.

21. A system for generating a temperature-compensated timing signal, the system comprising:
   a digitally controlled oscillator (DCO) configured to generate a temperature-dependent timing signal;
   a first counter coupled to a first microelectromechanical (MEMS) resonator and configured to generate:
      a first final count of oscillations of the first MEMS resonator, wherein the first final count spans a current update interval, and
      a first intermediate count of oscillations of the first MEMS resonator, wherein the start of the first intermediate count occurs at or after the start of the first final count, and the end of the first intermediate count occurs before the end of the first final count;
   a second counter coupled to a second MEMS resonator and configured to generate:
      a second final count of oscillations of the second MEMS resonator within the current update interval, wherein the first final count and the second final count are used to compute a final target DCO count, and
      a second intermediate count of oscillations of the second MEMS resonator, wherein the start of the second intermediate count occurs simultaneously with the start of the first intermediate count, and the end of the second intermediate count occurs simultaneously with the end of the first intermediate count;
   a third counter coupled to the DCO and configured to generate
      a third final count of oscillations of the DCO within the current update interval, wherein the third final count and the final target DCO count are used to compute a final loop error signal, and
      a third intermediate count of oscillations of the DCO within the current update interval, wherein the start of the third intermediate count occurs simultaneously with the start of the first intermediate count, and the end of the third intermediate count occurs simultaneously with the end of the first intermediate count; and
   a digital core coupled to the DCO, the first counter, the second counter, and the third counter and configured to:
      compute an intermediate target DCO count based on the first intermediate count and the second intermediate count,
      compute an intermediate loop error signal as a difference between the intermediate target DCO count and the third intermediate count, and
      modify an output frequency of the temperature-dependent timing signal generated by the DCO based on either the final loop error signal or the intermediate loop error signal.

22. The system of claim 21, wherein the digital core circuit is further configured to determine whether the intermediate loop error signal is significant.

23. The system of claim 22, wherein the intermediate loop error signal is significant, and the digital core circuit is configured to interrupt the current update interval before the end of the first final count.

24. The system of claim 23, wherein the digital core circuit is further configured to modify the output frequency based on the intermediate loop error signal.

25. The system of claim 23, wherein the digital core circuit is further configured to adjust the first final count based on the intermediate loop error signal.

26. The system of claim 25, wherein the first final count equals $2^N$, and the digital core circuit is configured to adjust the first final count by decreasing the value of N based on the intermediate loop error signal.

27. The system of claim 22, wherein the intermediate loop error signal is insignificant, and the digital core circuit is further configured to adjust the first final count based on the final loop error signal.

28. The system of claim 27, wherein the digital core circuit is further configured to compute a temperature parameter based on the first final count and the second final count.

29. The system of claim 28, wherein the final target DCO count is computed based on the temperature parameter.

30. The system of claim 27, wherein the digital core circuit is further configured to determine whether the final loop error signal is significant.

31. The system of claim 30, wherein the first final count equals $2^N$, and the digital core circuit is configured to adjust the first final count by adjusting a value of N based on the final loop error signal.

32. The system of claim 31, wherein the final loop error signal is determined to be insignificant and the first final count is adjusted by increasing N.

33. The system of claim 31, wherein the final loop error signal is determined to be significant, and the first final count is adjusted by decreasing N.

34. The system of claim 21, wherein the first final count equals $2^N$ counts at the end of the current update interval.

* * * * *